US005557927A

United States Patent [19]

Chiang et al.

[11] Patent Number: 5,557,927
[45] Date of Patent: Sep. 24, 1996

[54] BLANCHING RESISTANT COATING FOR COPPER ALLOY ROCKET ENGINE MAIN CHAMBER LINING

[75] Inventors: Kuang-Tsan K. Chiang, Agoura Hills; Sherwin Yang, Chatsworth, both of Calif.

[73] Assignee: Rockwell International Corporation, Seal Beach, Calif.

[21] Appl. No.: 554,665

[22] Filed: Nov. 8, 1995

Related U.S. Application Data

[63] Continuation of Ser. No. 192,528, Feb. 7, 1994, abandoned.
[51] Int. Cl.$^6$ ................................................ F02K 9/00
[52] U.S. Cl. ......................................... 60/257; 60/909
[58] Field of Search ............................. 60/257, 266, 271, 60/200.1, 909; 420/495, 497

[56] References Cited

U.S. PATENT DOCUMENTS

| 4,406,859 | 9/1983 | Toda et al. | 420/497 |
| 4,537,745 | 8/1985 | Hassler et al. | 420/495 |
| 5,188,799 | 2/1993 | Mori et al. | 420/495 |
| 5,233,755 | 8/1993 | Vandendriessche | 60/222 |

FOREIGN PATENT DOCUMENTS

| 57-200761 | 12/1982 | Japan . |
| 58-113368 | 7/1983 | Japan . |

OTHER PUBLICATIONS

"Investigation of Copper Alloy Combustion Chamber Degradation by Blanching," D. Berkman Morgan, T. Nguyentat, J. E. Franklin, and A. C. Kobayashi, NASA Conference Publication 3012, Advanced Earth-to-Orbit Propulsion Technology 1988, vol. II, pp. 506–527.

"Oxidation Studies of Cu–Cr–Coated Cu–Nb Microcomposite," K. T. Chiang and J. L. Yuen, Surface and Coatings Technology, 61 (1993) 20–24.

*Primary Examiner*—Timothy S. Thorpe
*Attorney, Agent, or Firm*—George A. Montanye; Harry B. Field; Steven E. Kahm

[57] ABSTRACT

Copper alloy rocket engine combustion chamber linings have been found to deteriorate when exposed to cyclic reducing/oxidizing (redox) environments which are a consequence of the combustion process. This deterioration, known as blanching, can be characterized by increased roughness and burn through sites in the wall of the combustion chamber lining and can seriously reduce the operational lifetime of the combustion chamber. The blanching problem can be significantly reduced by depositing a thin layer of Cu-30$^v$/$_o$Cr (a copper matrix with 30±10 volume percent of chromium) on the inside wall of the combustion chamber. The microstructure of the Cu-30$^v$/$_o$Cr coating consists of finely distributed chromium (Cr) particles in a copper (Cu) matrix. When exposed to an oxidizing environment at high temperatures, the coating forms a protective chromium scale which is stable in hydrogen atmospheres (e.g., substantially unreduced by high pressure hydrogen). The Cu-30$^v$/$_o$Cr coating can be applied, for example, using low temperature arc vapor deposition or low pressure plasma spray techniques.

6 Claims, 1 Drawing Sheet

BLANCHING RESISTANT COATING FOR COPPER ALLOY ROCKET ENGINE MAIN CHAMBER LINING

TABLE OF CONTENTS

1. BACKGROUND OF THE INVENTION
2. SUMMARY OF THE INVENTION
3. BRIEF DESCRIPTION OF THE DRAWINGS
4. DETAILED DESCRIPTION OF SPECIFIC EMBODIMENT
   4.1 Deposition of Protective Coating
   4.2 Test Data
   4.3 Conclusion
5. CLAIMS
ABSTRACT This application is a continuation of application Ser. No. 08/192,528, filed 7 Feb. 1994, entitled Blanching Resistant Coating for Cooper Alloy Rocket Engine Main Chamber Lining now abandoned.

1. BACKGROUND OF THE INVENTION

Copper alloy rocket engine combustion chamber linings have been found to deteriorate when exposed to cyclic reducing/oxidizing (redox) environments which are a consequence of the combustion process. This deterioration, known as blanching, can be characterized by increased roughness and burn through sites in the wall of the combustion chamber lining and can seriously reduce the operational lifetime of the combustion chamber.

One illustrative example of a copper alloy rocket engine combustion chamber that undergoes blanching is in the space shuttle main engine (SSME) propulsion system. A high pressure, high temperature rocket engine, the SSME burns a mixture of liquid oxygen and liquid hydrogen. During combustion, localized regions along the combustion chamber's wall lining become, alternatively, rich in oxygen (forming an oxidizing environment) and rich in hydrogen (forming a reducing environment). When a region of the combustion chamber's lining is exposed to an oxidizing environment, copper oxides form. Later, when exposed to a reducing environment, these copper oxides are reduced. The result of cycling a region of the chamber wall between an oxidizing and reducing environment is to cause the wall lining to become scarred and rough. This, in turn, can result in localized hot spots that reduce the operational (e.g., useful) lifetime of the combustion chamber.

One means of combating blanching is to coat the combustion chamber of a rocket engine with a protective lining as shown in FIG. 1. The published literature documents the long felt need for a rocket engine combustion chamber coating to reduce the blanching problem. See, for example, [D. Morgan, J. Franklin, A. Kobayashi, and T. Nguyentat, "Investigation of Copper Alloy Combustion Chamber Degradation by Blanching," Advanced Earth-to-Orbit Propulsion Technology Conference, May, 1988]. Recognized requirements for such a protective coating include: 1) oxidation and blanching resistance to 1200° to 1400° F., 2) minimum operational lifetime of 100 combustion cycles, 3) diffusional stability with respect to the copper alloy substrate, 4) good thermophysical properties—for example, high through-thickness thermal conductivity and thermal expansion compatible with copper alloy substrates, 5) insensitive to hydrogen diffusion, 6) minimal adverse effect on mechanical properties of the copper alloy substrate—for example, tensile strength, ductility, and low-cycle fatigue life, and 7) resist creep, thermal shock, and thermal fatigue.

2. SUMMARY OF THE INVENTION

The blanching problem can be significantly reduced by depositing a thin layer of Cu-30$^v$/$_o$Cr (a copper matrix with 30±10 volume percent chromium; $^v$/$_o$ stands for "volume percent") on the inside wall of the combustion chamber. The microstructure of the Cu-30$^v$/$_o$Cr coating comprises finely distributed chromium (Cr) particles in a copper (Cu) matrix. When exposed to an oxidizing environment at high temperatures, the coating forms a protective chromium oxide scale which is stable in hydrogen atmospheres (e.g., substantially unreduced by high pressure hydrogen). The Cu-30$^v$/$_o$Cr coating can be applied, for example, using low temperature arc vapor deposition or low pressure plasma spray techniques.

3. BRIEF DESCRIPTION OF THE DRAWINGS

4. DETAILED DESCRIPTION OF SPECIFIC EMBODIMENT

One illustrative embodiment of the invention is described below as it might be implemented for the Space Shuttle Main Engine (SSME) propulsion system whose main combustion chamber is NARloy-Z (Cu-3Ag-0.5Zr), a copper alloy. It will of course be appreciated that in the development of any actual implementation numerous implementation-specific decisions must be made to achieve the developers' particular goals. Moreover, it will be appreciated that such a development effort might be complex and time-consuming, but would nevertheless be a routine undertaking of engineering for those of ordinary skill having the benefit of this disclosure.

4.1 Deposition of Protective Coating

Figure 1:
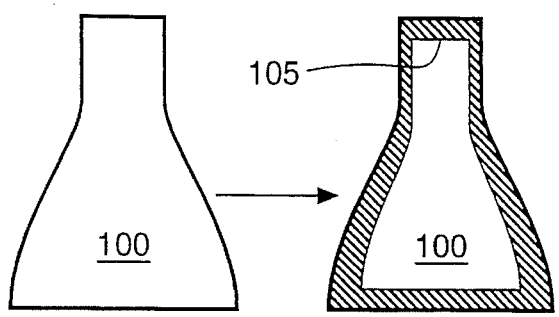
FIG. 1 is a representation of a rocket engine combustion chamber lining.
Figure 2:
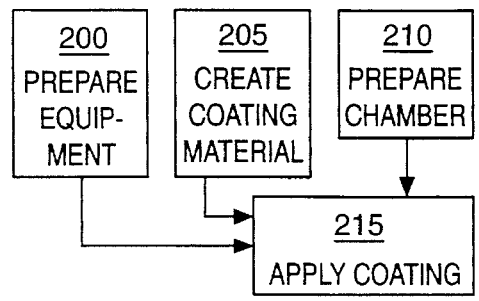
FIG. 2 is a flow diagram of a method in accordance with the invention.

FIG. 2 shows an overview of a process for protecting a high-temperature copper-alloy surface, such as a rocket engine combustion chamber 100, from oxidation effects such as blanching by depositing a very thin layer 105 of a copper-chromium composite on the surface.

An appropriate deposition material is provided at block 200. A composite of about 30±10 volume percent of chromium powder mixed into a copper-powder base or matrix and pressed into a rod or other suitable form has been found to be highly effective 205. Concentrations of chromium above 40% generally result in a significantly lower thermal conductivity for the resulting deposited layer. Such decreased thermal conductivity can undesirably reduce the effectiveness of forced exterior cooling systems such as rocket engine combustion chamber exterior cooling systems.

Chromium concentrations above 40% may of course be used in situations where lower thermal conductivity is acceptable. Concentrations of chromium below about 20% generally result in an insufficiently protective coating.

Figure 3:
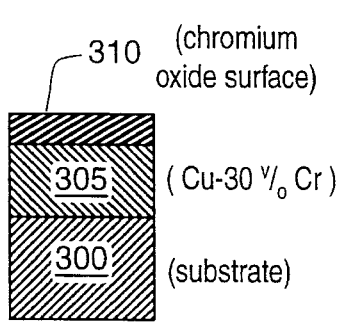
FIG. 3 is a block diagram of the invention's protective coating.

FIG. 3 shows the mechanism by which a copper matrix with 30±10 volume percent of chromium (hereafter referred to as Cu-30$^v$/$_o$Cr) is believed to protect an underlying copper alloy combustion chamber. As described in FIG. 2, the substrate 300 (e.g., interior of the SSME NARloy-Z combustion chamber) is first coated with a thin layer of Cu-30$^v$/$_o$Cr mixture 305 on the order of 25 microns (μm). During the combustion of liquid hydrogen and liquid oxygen, a thin layer of chromium oxide 310 ($Cr_2O_3$) forms on top of the Cu-30$^v$/$_o$Cr coating. It is this thin layer of chromium oxide that protects the combustion chamber lining from blanching.

Figure 4:
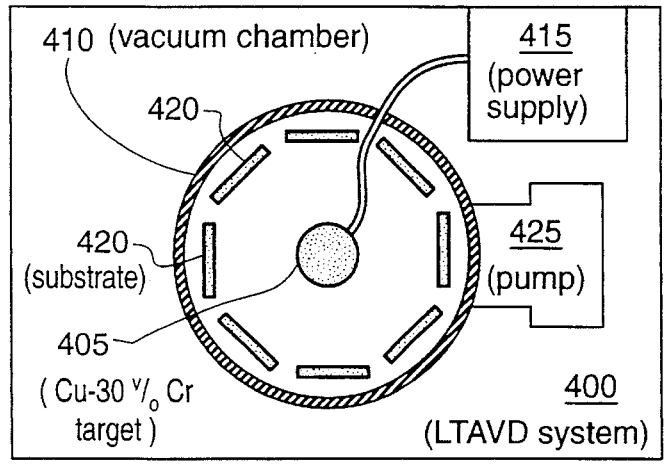
FIG. 4 is a block diagram representation of how a protective coating can be applied using a low temperature arc vapor deposition (LTAVD) technique.

Conventional vapor deposition techniques may be used to deposit the material on the surface to be protected. One embodiment of a suitable equipment arrangement for low temperature arc vapor deposition (LTAVD) is shown in FIG. 4. An LTAVD apparatus 400 is loaded with a rod 405 or other quantity of deposition material, placed in a vacuum chamber 410, and connected to a power supply 4 15. As shown at block 210, specimens 420 of the surfaces to be protected are arranged in any desired manner within the vacuum chamber 410. The specimens 420 may include quantities of material to be fabricated or may include an entire rocket engine combustion chamber. The vacuum chamber 410 is evacuated, e.g., with a suitable pump 425. At block 215, the LTAVD apparatus 400 is operated in a conventional manner to achieve the desired deposition layer 105, typically to a thickness of 25 μm. The thickness of the protective coating is related to its useful lifetime. The thicker the protective coating the longer it is viable as a protectant. On the other hand, the thicker the coating the more the combustion chamber weighs, decreasing the available payload capacity (for a given rocket engine system) of the vehicle.

Some comparative advantages and disadvantages of other deposition techniques for achieving the layer 105 are summarized in the following table:

NARloy-Z substrate material with Cu-30$^v$/$_o$Cr reduces the weight gain substantially.

Figure 5:
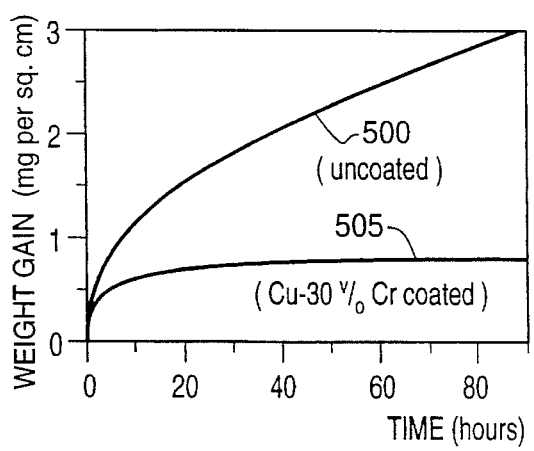
FIG. 5 is a graph showing oxidation kinetics of Cu-30$^v$/$_o$Cr coated NARloy-Z versus uncoated NARloy-Z combustion chamber material.

The weight gain of the NARloy-Z material shown in FIG. 5 is believed to be caused by the outward migration of copper cations (from the NARloy-Z material) which react with oxygen at its surface to form copper oxide. The copper oxide is not protective and, therefore, the material's surface becomes pitted and scarred when exposed to a hydrogen-rich environment. With a protective copper-chromium coating in accordance with the invention however, a protective chromium oxide layer forms at the interface between the copper-chromium coating and the atmosphere that acts as a barrier against outward copper cation migration (from the NARloy-Z material) and oxygen infusion (from the atmosphere). Thus, the inner surface of the protective coating (i.e. that portion of the protective coating in contact with the substrate material —FIG. 3) and the substrate material itself is substantially totally protected from oxidation.

Figure 6:
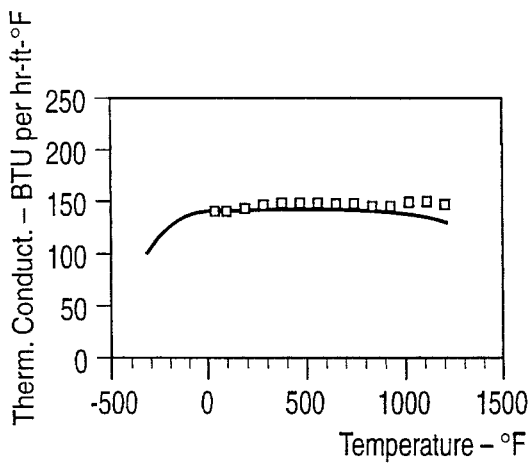
FIG. 6 is a graph showing the thermal conductivity of Cu-30$^v$/$_o$Cr coated Cu-15$^v$/$_o$Nb versus uncoated Cu-15$^v$/$_o$Nb.

FIG. 6 provides thermal conductivity test data on a Cu-30$^v$/$_o$Cr coated Cu-15$^v$/$_o$Nb substrate. As can be seen, the coated and uncoated substrate exhibit substantially the same thermal conductivity properties. Thus, the Cu-30$^v$/$_o$Cr coating does not adversely affect a copper alloy's thermal properties while it protects it from blanching. The solid line in FIG. 6 represents the thermal conductivity of uncoated Cu-15$^v$/$_o$Nb material. The 'open boxes' represent the thermal conductivity of Cu-15$^v$/$_o$Nb material that has been coated with Cu-30$^v$/$_o$Cr.

4.3 Conclusion

A thin coating of Cu-30$^v$/$_o$Cr can substantially protect a rocket engine's combustion chamber from blanching. Some properties of the coating include: 1) oxidation protection in air for 100 cycles at 1200° F.; 2) reduction in cracking and spalling during thermal cycling; 3) both constituents of the protective coating (copper and chromium) are compatible with hydrogen, e.g., they do not form hydrides; 4) diffusion stability with respect to a copper alloy substrate; and 5) no adverse effects on the mechanical properties of a copper alloy substrate such as tensile strength, ductility, and low cycle fatigue life. It should be noted that a protective coating

| Characteristic | LTAVD | Sputter | Plasma Spray | Electroplate |
| --- | --- | --- | --- | --- |
| Coating Energy per Ion (higher energy = better adhesion and density) | 60–100 eV | 0.1 eV | 25–50 eV | 1 eV |
| Ionization Percentage (higher percentage = rapid rate and complete reaction) | 90% | 30% | 20% | N/A |
| Vacuum Coating? (cleaner more uniform coatings) | Yes | Yes | No | No |
| Coating Structure (non-columnar provides best resistance to corrosion and wear) | Non-Columnar | Columnar | Non-Columnar | Non-Columnar |
| Versatility of Process (comparative test between listed techniques: 1 is best, 4 is worst) | 1 | 1 | 1 | 2 |
| Thermal Effect on Substrate (comparative test between listed techniques: 1 is best, 4 is worst) | 1 | 2 | 4 | 3 |

4.2 Test Data

As illustrated in FIG. 5, plot 500 shows the rapid increase in weight of a NARloy-Z substrate material when uncoated. As can be seen by comparing plot 500 to plot 505, coating in accordance with the invention is applicable to other copper alloys besides NARloy-Z. For instance, OFHC (oxygen free, high conductivity) copper and beryllium-copper alloys.

The inventive method described herein is useful in situations in which a copper alloy needs good thermal conductivity and protection from an oxidizing environment. Possible uses include heat exchanger surfaces, low-temperature turbines, and cookware surfaces.

It will be appreciated by those of ordinary skill having the benefit of this disclosure that numerous variations from the foregoing illustration will be possible without departing from the inventive concept described herein. Accordingly, it is the claims set forth below, and not merely the foregoing illustration, which are intended to define the exclusive rights claimed in this application program.

5. CLAIMS

What is claimed is:

1. A method of protecting a copper-based alloy rocket engine combustion chamber from blanching, comprising the steps of:

(a) placing a copper-chromium mixture comprising 30±10 volume percent chromium in said combustion chamber;

(b) evacuating said combustion chamber to a specified degree of vacuum; and (c) vapor-depositing said copper-chromium mixture on a surface of said combustion chamber.

2. A method of protecting a copper-based alloy surface in a high-temperature oxidizing environment, comprising the steps of:

(a) providing a copper-chromium mixture comprising a specified volume percentage of chromium in a copper matrix; and (b) depositing said copper-chromium mixture on said surface.

3. The method of claim 2, wherein said copper-chromium mixture comprises 30±10 volume percent chromium.

4. A copper-based alloy rocket engine combustion chamber having a copper-chromium interior coating.

5. The rocket engine combustion chamber of claim 4, wherein said interior coating comprises 30±10 volume percent chromium.

6. A high-temperature oxidation protection composite comprising 30±10 volume percent chromium in a copper matrix.

* * * * *